(12) United States Patent
Seidler et al.

(10) Patent No.: US 7,189,083 B2
(45) Date of Patent: Mar. 13, 2007

(54) METHOD OF RETAINING A SOLDER MASS ON AN ARTICLE

(75) Inventors: Jack Seidler, Flushing, NY (US); Aleksandr Zhitomirsky, Brooklyn, NY (US)

(73) Assignee: Interplex Nas, Inc,, Flushing, NY (US)

( * ) Notice: Subject to any disclaimer, the term of this patent is extended or adjusted under 35 U.S.C. 154(b) by 0 days.

(21) Appl. No.: 10/509,200

(22) PCT Filed: Apr. 1, 2003

(86) PCT No.: PCT/US03/10149

§ 371 (c)(1),
(2), (4) Date: Sep. 28, 2005

(87) PCT Pub. No.: WO03/085697

PCT Pub. Date: Oct. 16, 2003

(65) Prior Publication Data

US 2006/0057902 A1    Mar. 16, 2006

Related U.S. Application Data

(60) Provisional application No. 60/369,413, filed on Apr. 1, 2002.

(51) Int. Cl.
*H01R 12/00* (2006.01)

(52) U.S. Cl. ........................ 439/83; 439/876; 228/56.3; 228/246; 174/94 R; 174/263

(58) Field of Classification Search ................. 439/83, 439/876; 174/94 R, 263; 228/56.3, 246
See application file for complete search history.

(56) References Cited

U.S. PATENT DOCUMENTS

| | | | | | |
|---|---|---|---|---|---|
| 3,744,129 | A | * | 7/1973 | Dewey, Jr. | 29/837 |
| 4,712,721 | A | * | 12/1987 | Noel et al. | 228/56.3 |
| 5,471,368 | A | * | 11/1995 | Downie et al. | 361/760 |
| 5,509,203 | A | * | 4/1996 | Yamashita | 29/879 |
| 5,673,846 | A | * | 10/1997 | Gruber | 228/180.22 |
| 5,688,150 | A | | 11/1997 | Seidler et al. | |
| 5,709,574 | A | | 1/1998 | Bianca et al. | |
| 6,261,136 | B1 | | 7/2001 | Dennis | |
| 6,294,745 | B1 | * | 9/2001 | Gruber | 174/263 |
| 6,452,112 | B1 | * | 9/2002 | Terashima et al. | 174/260 |
| 6,461,188 | B2 | | 10/2002 | Reul | |
| 6,494,754 | B2 | | 12/2002 | Cachina et al. | |
| 6,534,726 | B1 | * | 3/2003 | Okada et al. | 174/263 |
| 7,043,830 | B2 | * | 5/2006 | Farnworth | 29/842 |
| 2002/0029905 | A1 | * | 3/2002 | Okada et al. | 174/263 |
| 2004/0164124 | A1 | * | 8/2004 | Lundstrom et al. | 228/135 |

* cited by examiner

*Primary Examiner*—Gary F. Paumen
(74) *Attorney, Agent, or Firm*—Darby & Darby (57) ABSTRACT

A method of retaining a solder mass to a solder-bearing article is provided and includes the steps of: (a) forming a plurality of openings in the solder-bearing article; (b) disposing a length of solder mass over at least some of the plurality of openings; and forming a plurality of solder rivets along the length of the solder mass. The solder rivets serve to retain the length of solder mass to the solder-bearing article. The solder-bearing article includes any number of different types of components where a solder mass is held thereby, e.g., leads, terminals, connectors, electromagnetic shields, etc.

10 Claims, 9 Drawing Sheets

METHOD OF RETAINING A SOLDER MASS ON AN ARTICLE

CROSS-REFERENCE TO RELATED APPLICATIONS

This application is the 371 National Phase of International Application No. PCT/US03/10149, filed Apr. 1, 2003, which was published in English under PCT Article 21(2) as International Publication No. WO 03/085697, which claims priority of U.S. Provisional Application No. 60/369,413, filed Apr. 1, 2002.

TECHNICAL FIELD

The present invention relates generally to solder-bearing articles, such as devices used for joining electronic components to one another, electrical leads, terminals, electromagnetic shields, and furthermore, to a method for retaining a solder mass in such solder-bearing articles.

BACKGROUND

It is often necessary and desirable to electrically connect one component to another component. For example, a multi-terminal component, such as a connector, is often electrically connected to a substrate, such as a printed circuit board, so that the contacts or terminals of the component are securely attached to contact pads formed on the substrate to provide an electrical connection therebetween. One preferred technique for securely attaching the component terminals to the contact pads is to use a solder material.

In the electronic equipment industry, an important necessity is the rapid and accurate assembly of leads, terminals and contacts with contact pads of printed circuit boards (PCB) and other substrates. For convenience of connecting such elements, it has previously been disclosed to facilitate the soldering of their connection by securing a solder slug or mass to one of the elements so that, when positioned in engagement with the other element and heated, the molten solder will cover the adjacent surfaces of both elements to form when cooled a solder joint providing both a mechanical coupling and an electrical connection between the elements.

One disadvantage of using solder masses is that the solder masses first have to be formed to have the proper dimensions and then the solder masses have to be coupled to solder-holding elements (e.g., solder clips) before the solder reflow operation is performed. In the case where the solder-holding elements are in the form of a series of claw-like structures formed as part of clips that are spaced along a carrier strip, the claw-like structures are first formed by bending portions of the clip and then one solder mass has to be disposed within one claw-like structure. This can be a time consuming task.

However, what is needed as an alternative method of holding a solder mass on a solder-bearing device such that the solder mass is securely held by the solder-bearing device; however, the method should be neither overly complex nor time consuming.

SUMMARY

A method is provided for securely retaining a solder mass to a solder-bearing article having a first face and a second face. The method includes the steps of: (a) forming a plurality of openings in the solder-bearing article; (b) disposing a length of solder mass along the first face such that the solder mass is disposed over at least some of the plurality of openings; and (c) forming a plurality of solder rivets by compressing sections of the solder mass into at least some of the plurality of openings such that each compressed solder mass section extends through the opening and beyond the second face to form one solder rivet. The formation of solder rivets along the length of the solder mass acts to retain the solder mass to the solder-bearing article.

The plurality of the openings can be formed at an edge of the body or can be formed in a medial section between edges. The present method of forming solder rivets provides an effective yet easy manner of securely retaining the solder mass before and during a connection operation where the solder-bearing article is connected to another member, such as a substrate, e.g., a printed circuit board or where the solder-bearing article is used in another manner.

The solder-bearing article can be a solder-bearing component in the form of many of the traditional components that are configured to hold a solder mass. For example, the solder-bearing component can be an electrical lead, a terminal connected to an electrical device, a connector for electrically connecting first and second electrical devices, a clip, an electromagnetic shield, etc. In sum, the present method is applicable to a number of applications where a solder mass is held and securely retained in an device for providing an electrical and mechanical connection upon solder reflow.

Other features and advantages of the present invention will be apparent from the following detailed description when read in conjunction with the accompanying drawings.

BRIEF DESCRIPTION OF THE DRAWINGS

The foregoing and other features of the present invention will be more readily apparent from the following detailed description and drawings of illustrative embodiments of the invention in which.

DETAILED DESCRIPTION OF THE PREFERRED EMBODIMENTS

Figure 1:
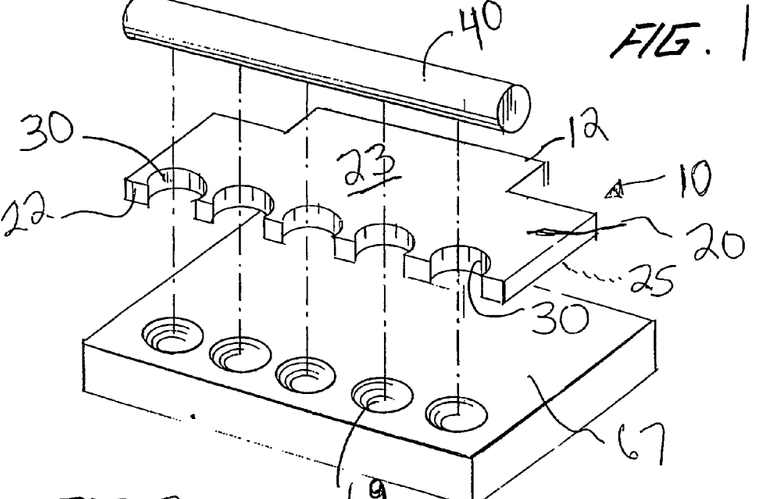
FIG. 1 is an exploded perspective view of a lead formed to hold a solder mass and a die used to form a plurality of solder rivets which retain the solder mass to the lead body.
Figure 2:
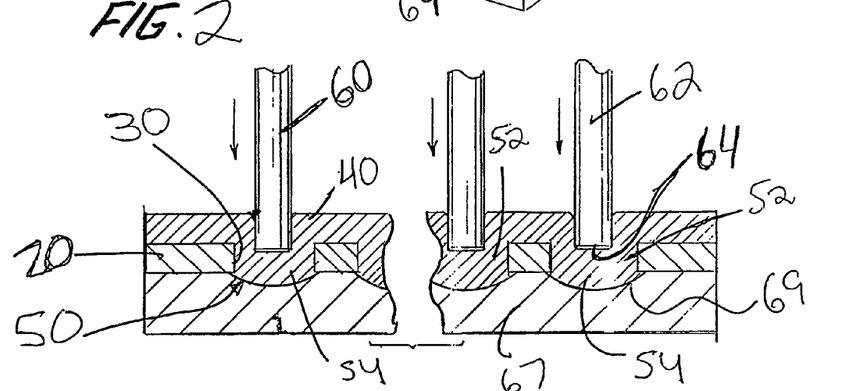
FIG. 2 is a cross-sectional side view of the assembly of FIG. 1 with a first exemplary tool compressing discrete sections of the solder mass into the die to form solder rivets.
Figure 4:
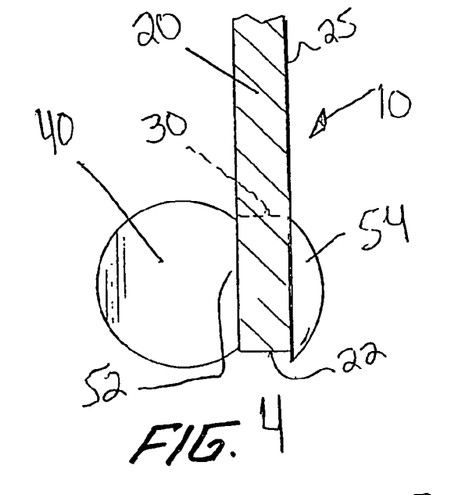
FIG. 4 is an end elevational view of the lead of FIG. 1 illustrating the solder mass being held thereto by the formation of solder rivets along a length of the solder mass.

In the first several embodiments described herein, the solder-bearing article is in the form of a solder-bearing component for use in electrical applications. Referring first to FIGS. 1–2 and 4, an individual lead according to one exemplary embodiment is generally indicated at 10. The lead 10 can be formed by any number of conventional techniques, including forming the lead 10 by stamping from a conductive strip (e.g., beryllium copper or like resilient and conductive material). Each lead 10 includes an elongated strip 12 (which may be attached at one end to a carrier strip (not shown)) that attaches at one end to an elongated body 20. The elongated body 20 includes a plurality of slots or openings 30 that are formed in the body 20 along a length thereof. In the exemplary embodiment, the slots 30 are formed at a lower edge 22 of the body 20 and are defined by an open first end at the lower edge 22 and a closed second end. In the illustrated embodiment, the second end of the slot 30 is rounded; however, it will be understood that the slot 30 can be formed to have any number of shapes, i.e., a tapered shape or rectangular shape, etc. The slots 30 can be formed using any number of conventional techniques, including forming the slots 30 by a punching process. The slots 30 can also be formed at prescribed locations so that the distance between adjacent slots is controlled. The distance between adjacent slots 30 can be the same for all of the slots 30 or the distance between some slots 30 can vary relative to the distance between other slots 30.

The lead 10 is formed of suitable conductive material and has a thickness that can vary depending upon the application.

The slots 30 are designed to retain a solder mass 40 along the lower edge 22 of the body 20 to permit the body 20 to be electrically connected to another device, surface or the like as a result of performing a soldering operation. The solder mass 40 preferably comprises a solder wire having a sufficient length to extend a length of the body 20 and be captured and retained within the slots 30 in a manner which will be described in greater detail hereinafter. As best shown in FIGS. 2 and 4, the solder mass 40 is retained along the lower edge 22 of the body 20 by forming a series of solder rivets, generally indicated at 50, within the slots 30. The malleable characteristics of the solder mass 40 permit it to easily be compressed at selected sections thereof to form the solder rivets 50 as shown in the Figs.

Still referring to FIGS. 1–2 and 4, a method of securely holding the solder mass 40 along the body 20 is provided. The method includes first forming the slots 30 within the body 20 using the above-described conventional techniques. After the slots 30 are formed at the lower edge 22, a length of solder mass 40 is disposed against one face 23 of the body 20 such that the solder mass 40 extends across the slots 30.

A tool is then used to form the solder rivets 50 by compressing sections of the solder mass 40 into the slots 30. In a first embodiment, a first tool 60 is used. The tool 60 is in the form of one or more punches or mandrels each in the form of elongated body 62 having a distal end 64 that contacts the solder mass 40 and compresses a segment of the solder mass 40 into a respective slot 30. Preferably, one mandrel (punch) 62 is provided for each slot 30. According to this embodiment, the distal end 64 has dimensions that are less than the dimensions of the slot 30, thereby permitting the distal end 64 to at least partially enter the slot 30 during the formation of the solder rivet 50. According to the exemplary embodiment that is illustrated, the mandrel 62 is a rod-like member having a circular or generally circular cross-section. The diameter of the mandrel 62, especially the distal end 64, is thus less than the diameter of the slot 30, thereby permitting the distal end 64 to be received within the slot 30.

The tool 60 is then positioned so that each mandrel 62 is in axial alignment with one slot 30, with the respective distal end 64 facing the solder mass 40 and being slightly spaced therefrom. The tool 60 is preferably part of an automated system that is computer controlled so that the tool 60 can be moved into the correct position to form the solder rivet 50. For example, the tool 60 can be a part of a pneumatically operated system where the tool 60 is pneumatically driven by a controller that is in communication with a computer system that monitors the position of the tool 60 and also the position of the body 20. The computer controlled system is designed so that the relative positions between the slots 30 and a plurality of mandrels 62 are determined and/or controlled. This permits the body 20 and the mandrels 62 to be placed into proper alignment with respect to one another.

The tool 60 can be driven by other types of systems besides a pneumatic system and it will also be appreciated that the tool 60 can be manually driven. It will also be appreciated that when the tool 60 is part of an automated system, a number of mandrels 62 can be arranged in a series and connected to a single support member such that the movement of the support member causes movement of all of the connected mandrels 62 in the same direction. The tool 60 is then driven from the first axially aligned position into the second position illustrated in FIG. 2. In the second, extended position, the tool 60 is driven such that each distal end 64 contacts the solder mass 40 that is formed above one slot 30. By driving the mandrel 62 into this segment of solder mass 40, the solder mass 40 is compressed into the slot 30 such that the solder mass 40 occupies all of or a substantial area of the slot 30. A portion of the solder mass 40 that is compressed into the slot 30 actually extends beyond a second face 25 of the body 20, as illustrated in FIG. 2. This portion forms a solder head 54.

Preferably, a die 67 is provided to shape the solder head 54 into a desired shape, e.g., a hemispherical shape. The die 67 thus has a series of cavities 69 formed therealong, with the cavities 69 being spaced so that the cavities 69 are axially aligned with the slots 30. This alignment permits the compressed solder mass 40 that is directed into the slot 30 and beyond the second face 25 to be received within the cavity 69. The cavity 69 is therefore only intended to receive the solder mass 40 that extends beyond the second face 25 and shape this solder mass 40 into a hemispherically shaped head (or some other head shape). In other words, the cavity 69 constrains the height and the flow of the solder mass 40 into a hemispherically shaped head. In this embodiment, the cavity 69 thus has a circular crater shape with only a slight depth since the amount of solder mass 40 that is compressed to a state extending beyond the second face 25 is typically not that great relative to the overall total amount of the solder mass.

After the tool 60 has been driven to its second position to cause a segment of the solder mass 40 to be compressed into the slot 30, the tool 60 is then retracted from the solder mass 40 and the lead 10 is withdrawn from the die 67. The solder mass 40 is thus no longer contained within a single plane along the first face 23 but rather a solder rivet 50 is formed and is defined by a stem portion 52 generally disposed within the slot 30 and the head 54 which is formed generally on the second face 25 of the body 20. When viewed from the first face 23 side, the solder mass 40 has a series of recessed sections which are axially aligned with respective slots 30 and when viewed from the opposite second face 25 side, a series of spaced heads 54 are seen.

Figure 5:
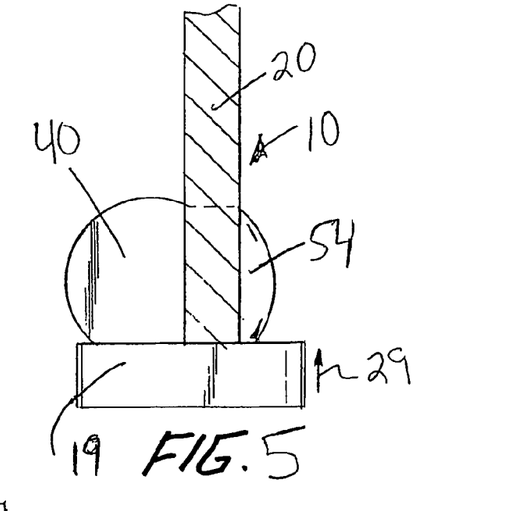
FIG. 5 is an end elevational view of the lead of FIG. 4 illustrating an optional coining device being used to make the solder mass coplanar with a lower edge of the lead.

By compressing the solder mass 40 into the slots 30, the solder mass 40 is effectively held along the lower edge 22 of the body 20 and the lead 10 is ready for attachment to a device or surface. Optionally, and as shown in FIGS. 4–5, the solder mass 40 is coined using a conventional coining device 19. In a conventional coining operation, a force is applied by the device 19 in the direction indicated by arrows 29 against the solder mass 40 disposed along the first face 23 and the heads 54 disposed along the second face 25 So as to compress the solder mass 40, thereby causing the solder mass 40 to become more co-incident with the lower edge 22 of the body 20. In other words, the coplanarity between the lower edge 22 and the solder mass 40 increases. The coining operation thus reduces the degree that the solder mass 40 extends below the lower edge 22. This creates a better solder joint as the lower edge 22 is the surface that will contact and be connected to another surface.

Figure 3:
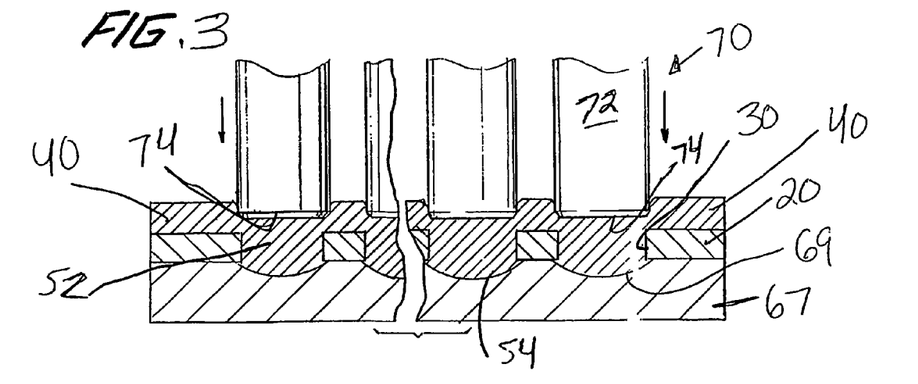
FIG. 3 is a cross-sectional side view of the assembly of FIG. 1 with a second exemplary tool compressing discrete sections of the solder mass into the die to form solder rivets.

FIGS. 1 and 3 illustrate another exemplary embodiment for retaining the solder mass 40 along the lower edge 22 of the body 20. This embodiment is very similar to the previous embodiment with the exception that the dimensions of the tool relative to the slot 30 are different. More specifically, in this embodiment, a tool 70 is used. The tool 70 is similar to the tool 60 in that both are used in a punching process; however, the tool 70 has dimensions that are substantially greater than the dimensions of the slot 30. As with the prior embodiment, the tool 70 is formed of a number of punches or mandrels 72 that are all preferably interconnected so that all of the mandrels 72 can be moved uniformly. As shown in FIG. 3, the diameter of the mandrel 72 is substantially greater than the diameter of the slot 30 and therefore, when the tool 70 is driven into the extended, second position, each mandrel 72 compresses the highly malleable solder mass 40 such that a portion of the solder mass 40 is directed into the slot 30 and beyond the second face 25. The die 67 is also preferably positioned adjacent the body 20 with the cavities 69 aligned with the slots 30 so that each cavity 69 shapes the solder mass 40 into the head 54.

After the tool 70 has been driven to its second position to cause a segment of the solder mass 40 to be compressed into the slot 30, the tool 70 is then retracted from the solder mass 40 and the lead 10 is withdrawn from the die 67. The solder mass 40 is thus no longer contained within a single plane along the first face 23 but rather a solder rivet 50 is formed and is defined by the stem portion 52 generally disposed within the slot 30 and the head 54 which is formed generally on the second face 25 of the body 20. As with the first embodiment, the solder mass 40 has a series of recessed sections which are axially aligned with respective slots 30 after the tool 70 is removed and when viewed from the opposite second face 25 side, a series of spaced heads 54 are seen.

By compressing the solder mass 40 into the slots 30, the solder mass 40 is effectively held along the lower edge 22 of the body 20 and the lead 10 is ready for attachment to a device or surface. The solder mass 40 can be coined using a conventional coining operation as described hereinbefore with reference to FIG. 5.

Figure 6:
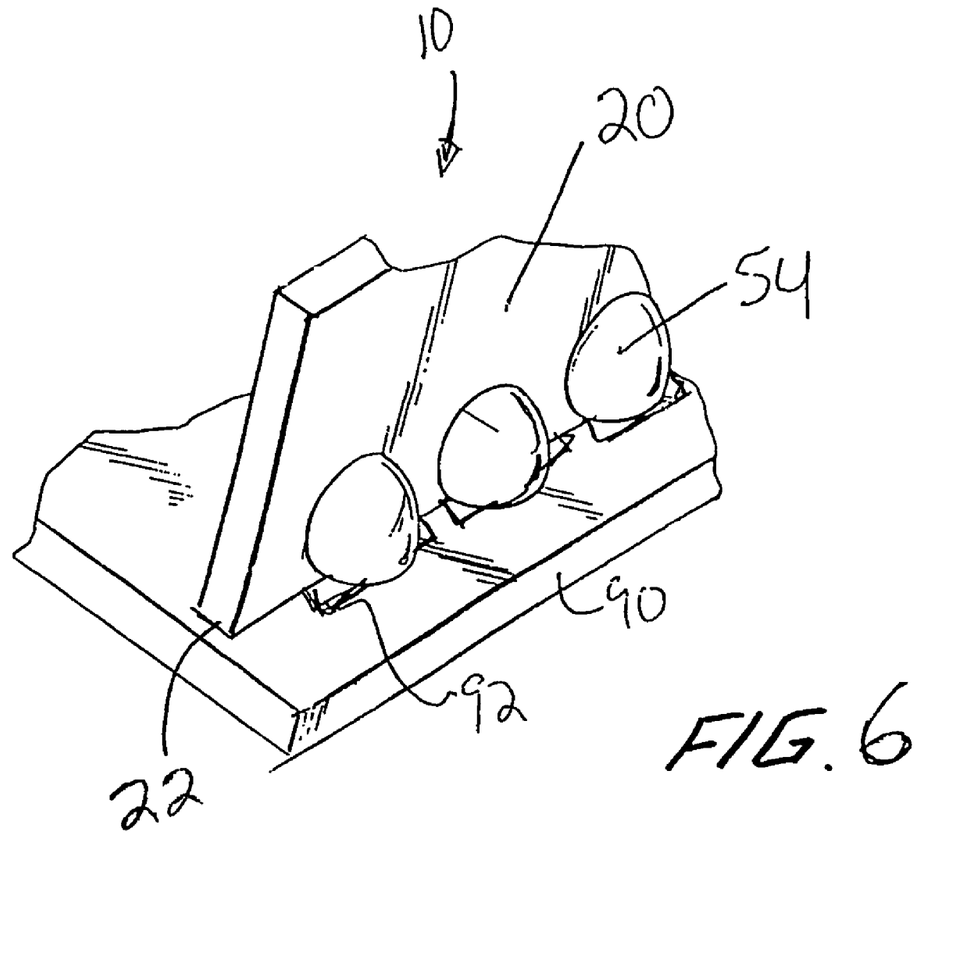
FIG. 6 is a perspective view of the lead of FIG. 5 positioned on an electrical component, such as a printed circuit board, prior to a solder reflow operation being performed.
Figure 7:
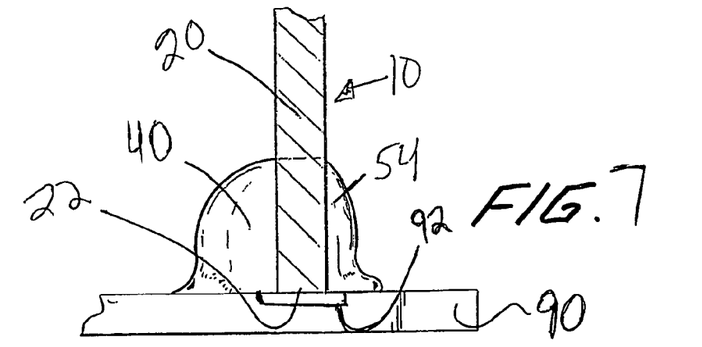
FIG. 7 is an end elevational view of the lead of FIG. 6 being securely mounted to the electrical component after the solder reflow operation has been performed.
Figure 8:
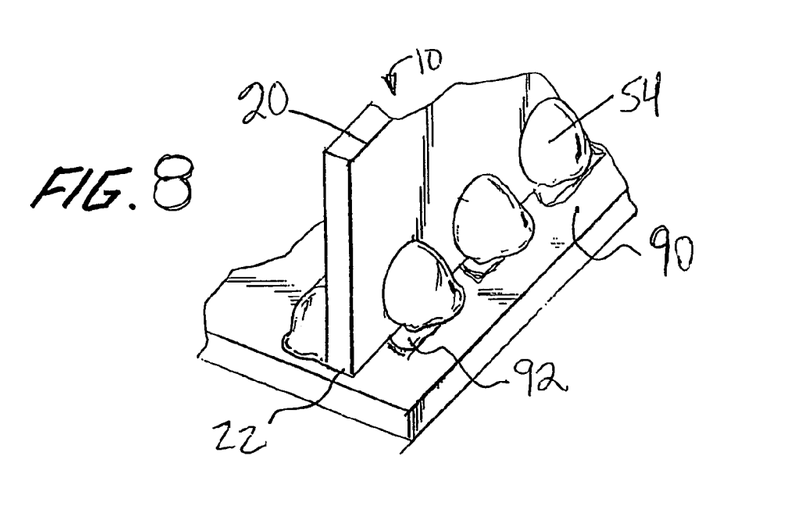
FIG. 8 is a perspective view of the lead and electrical component of FIG. 7.

FIGS. 6–8 illustrate the positioning of the lead 10 on an electrical component 90, such as a printed circuit board, that contains at least one conductive area or pad 92 to which it is desired to solder to a portion (e.g., the lower edge 22) of the lead 10. The electrical component 90 is a generally planar device and the lower edge 22 is disposed flush against and extending across the planar surface of the electrical component 90. The lead 10 extends across one or more pads 92 that are formed axially across the component 90. By performing the above-described coining operation, a better fit results between the lower edge 22 and the electrical component 90 and more specifically, the pad 92 thereof. When the lead 10 seats against the electrical component 90, the lead 10 is preferably orientated perpendicular to the electrical component 90. A solder reflow operation is performed, which results in the solder mass 40 reflowing to establish a secure electrical connection between the lead 10 and the electrical component 100. As a result of the solder operation, the solder mass on both the first face 23 and the solder heads 54 on the second face 25 reflow, as show in FIGS. 7 and 8.

Figure 9:
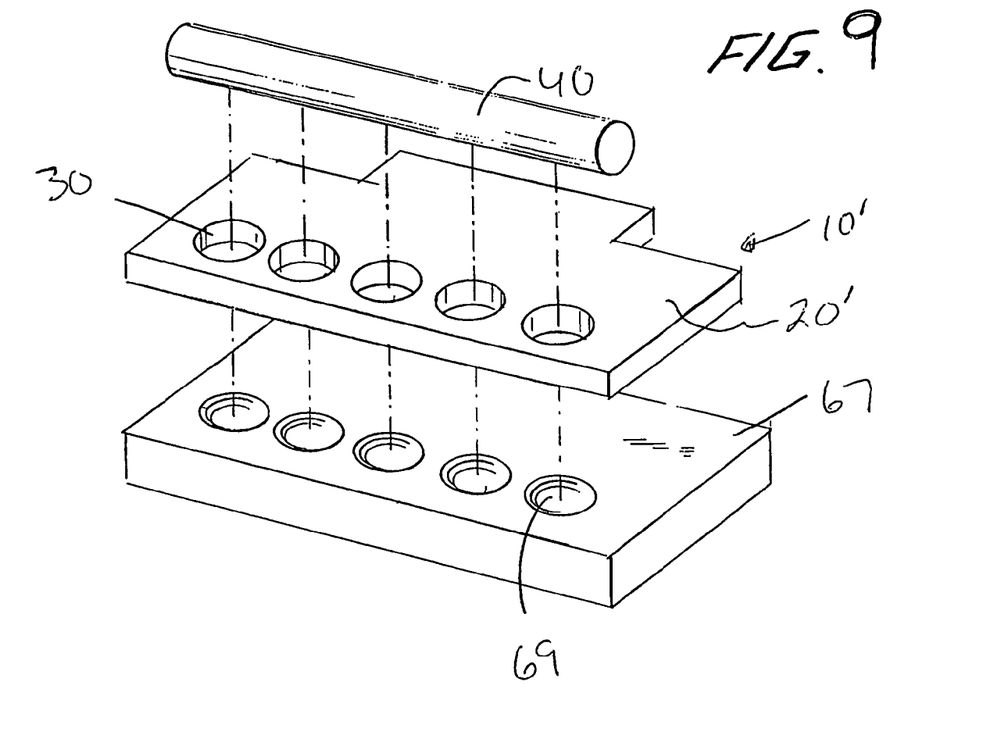
FIG. 9 is an exploded perspective view of a lead according to another embodiment.

FIG. 9 illustrates yet another exemplary lead embodiment. The lead 10' is similar to the lead 10 with the exception that the openings or slots 30 are not formed at one edge there; but rather, they are formed away from the lower edge 22. In other words, the body 20' is formed completely around the openings 30. In the illustrated embodiment, the openings 30 have circular shapes; however, the openings 30 can have any number of other shapes. The solder mass 40 is disposed on the first face 23 over the openings 30 and then one of the tools 60, 70 (FIGS. 2 and 3) is used to form a series of solder rivets to securely bind the solder mass 40 to the body 20'.

Figure 10:
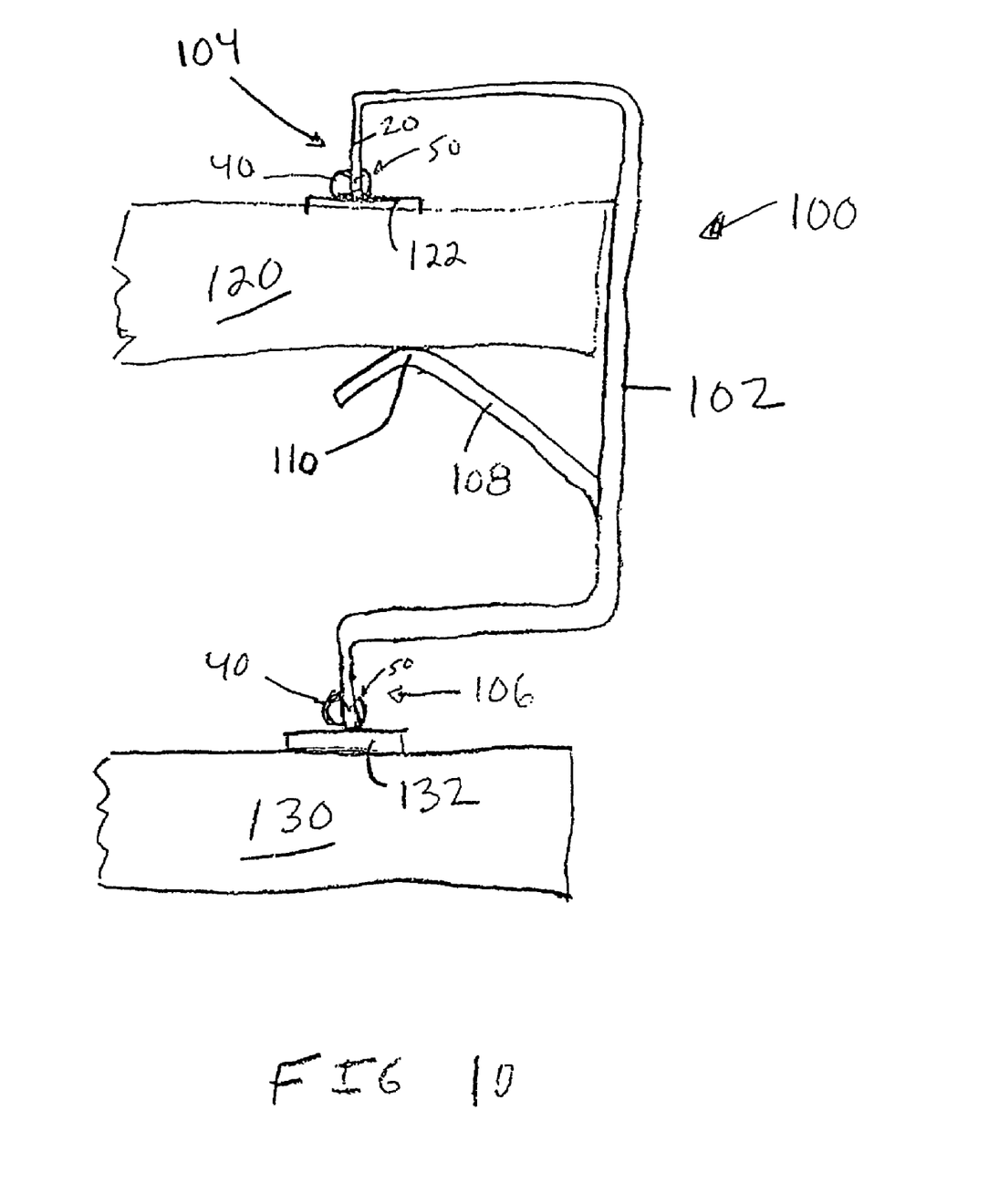
FIG. 10 is a side elevational view of an edge solder-bearing clip for a printed circuit board and is adapted for surface mounting on a substrate.

The above methods of retaining a solder mass within a solder-bearing component that are disclosed herein are not limited to application to electrical leads, contacts, and terminals; but rather, can be applied to any component that is configured to carry a solder mass. For example and as shown in FIG. 10, the present method finds applicability in another type of lead 100 for a printed circuit board 120, where the lead is adapted for surface mounting on a substrate 130. More specifically, the lead 100 has an elongated body section 102 that includes a first solder-bearing portion 104 formed at a first end thereof and a second solder-bearing portion 106 formed at a second end thereof. Each of the solder-bearing portions 104, 106 is similar or identical in construction to the body 20 of the lead 10 of FIG. 1 in that each of the solder-bearing portions 104, 106 has a plurality of slots 30.

The solder mass 40 (e.g., a solder wire) is compressed within the slots to form the solder rivets 50 in the same manner described above to provide two solder-bearing portions 104, 106 each having a solder-mass 40 securely retained along a length thereof. Optionally, the lead 100 includes a resilient finger 108. The resilient finger 108 includes a bend 110 opposite the solder mass 40 to provide a springy gap between the solder mass 40 (and distal end of the fingers 30) and the bend 110 within which may be inserted the circuit board or other substrate 120. The circuit board 120 has a conductive area or pad 122 to which it is desired to solder to a portion (e.g., the solder-bearing portion 104) of the lead 100. The resiliency of the finger 108 serves to retain the lead 100 in position on the circuit board 120 before the soldering is done, and as the solder melts upon application of heat, the finger 108 serves to allow the lower edge of the body 20 to move into contact with the conductive area 122, to provide good electrical contact between the lead 100 and the circuit board 120 when the solder re-solidifies. In this embodiment, the lead 100 acts as an edge clip for the circuit board 120, and the terminal end of the lead 100 can be suitably formed in a number of ways for connection to other equipment, such as being formed as a pin for insertion into a contact receptacle, or as a wire-wrap post termination, or as a further solderable arrangement (as shown in FIG. 10).

More specifically, the terminal end of the lead 100 of FIG. 10 likewise contains a solderable arrangement in the form of the solder-bearing portion 106, which is essentially the same as the solder-bearing portion 104 at the opposite end of the lead 100. The terminal solder-bearing portion 106 can be used for surface mounting the circuit board 120 on the further substrate 130 for connection to a conductive area 132 of the substrate 130.

Figure 11:
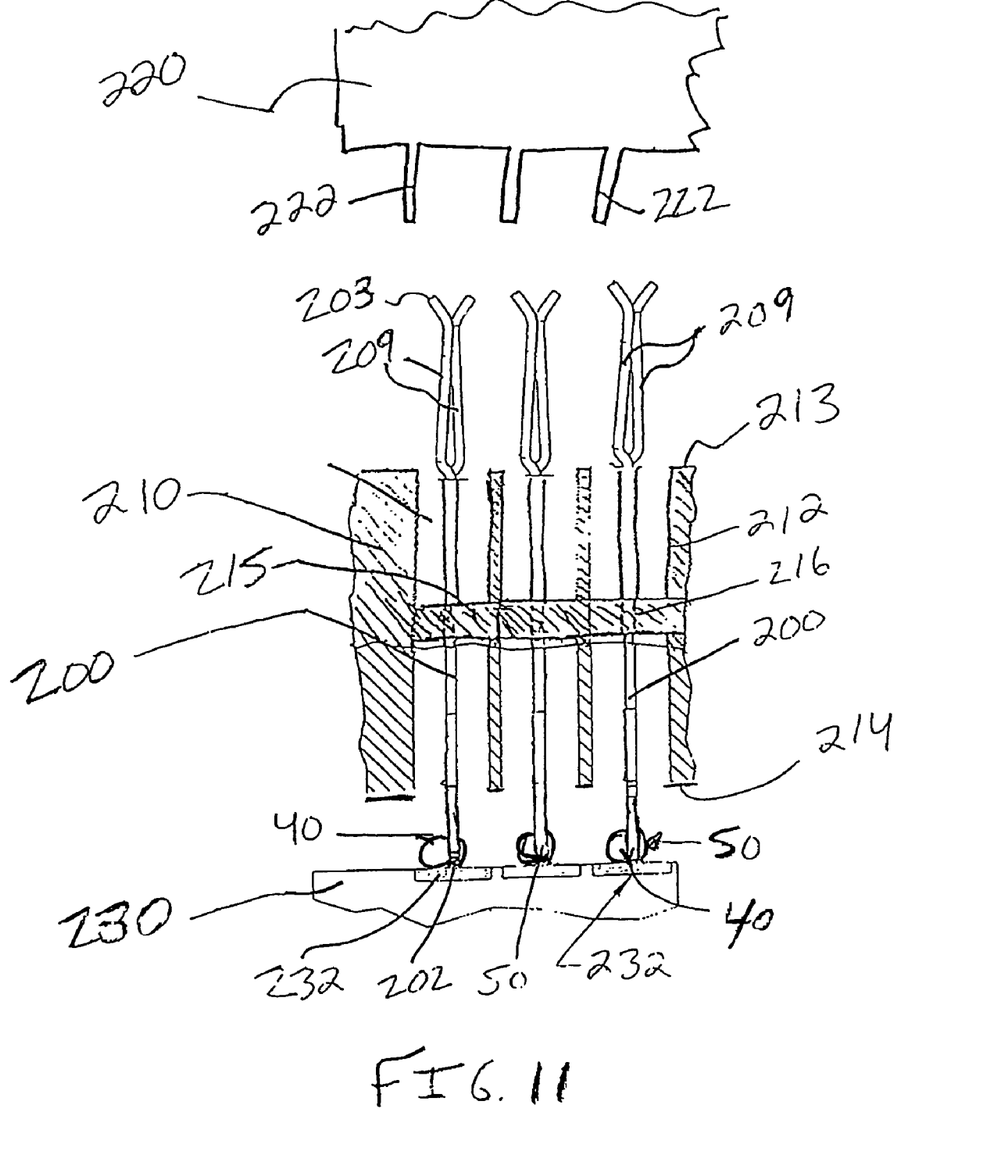
FIG. 11 is a side elevational view of one exemplary connector assembly, wherein a plurality of solder-bearing contacts are disposed in a connector housing to provide an electrical connection between two electronic devices, partially shown.

Now referring to FIG. 11 in which the solder-retaining arrangement/method of the present application is used to hold a solder mass in a contact 200 (i.e. terminal pin) that forms a part of a connector 210 for electrically connecting a first electronic device 220 to a second electronic device 230. The connector 210 has a predetermined number of contacts 200 arranged in a predetermined pattern. Each end 202 of each contact 200 includes at least one solder mass 40 that is held by forming solder rivets 50. The formation of solder rivets 50 is preferably similar to or identical to that which is described herein with reference to lead 10 of FIG. 1 and therefore, these features will not be described in great detail again. The connector 210 includes a housing 212 having a first surface 21 3 and an opposing second surface 214. Preferably, the connector 210 is a generally planar member so that the first and second surface 213, 214 are planar surfaces lying parallel to one another.

The housing 212 has a longitudinal cross member 215 formed between the first and second surfaces 213, 214. The cross member 215 has a plurality of openings 216 formed therein for receiving the plurality of contacts 200. The contacts 200 extend through the openings 216 such that the ends 202 of the contacts 200 protrude below the second surface 214 and opposing ends 203 of the contacts 200 protrude above the first surface 213 to permit the ends 202 to be separably connected to terminals 222 or the like of the first electronic device 220. In the exemplary embodiment, each end 203 includes a feature which permits the first electronic device 220 to be separably connected to the contact 200 at the end 203 thereof. For example, the end 203 can include a pair of biased contacting forks 209 which receive the terminal 222 of the first electronic device 220. The terminal 222 can be forcibly received between the forks 209 to provide an electrical connection between the terminal 222 and the contact 200. Other types of connecting mechanisms can be provided at end 203 to provide a separable connection between the first electronic device 220 and the contact 200.

The end 202 of the contact is designed to be electrically connected to the second electrical device 230 to provide an electrical connection between contacts 232 (surface mount solder pads) of the second electrical device 230 and the solder mass 40 at the end 202 of the contact 200. The ends 202 of the contacts 200 extend a sufficient distance beyond the second surface 214 to permit the solder mass 40 to be compressed to form the solder rivets 50 within the slots 30. Thus, in one embodiment, the second closed ends of the slots 30 formed in the end 202 are formed near or at the second surface 214 of the connector 210. After the solder mass 40 is retained along the lower edge of each contact 200 and the contacts 200 are disposed relative to the contacts 232, each solder mass 40 is heated and it reflows on one contact 232 and upon cooling, an electrical connection is formed.

Figure 12:
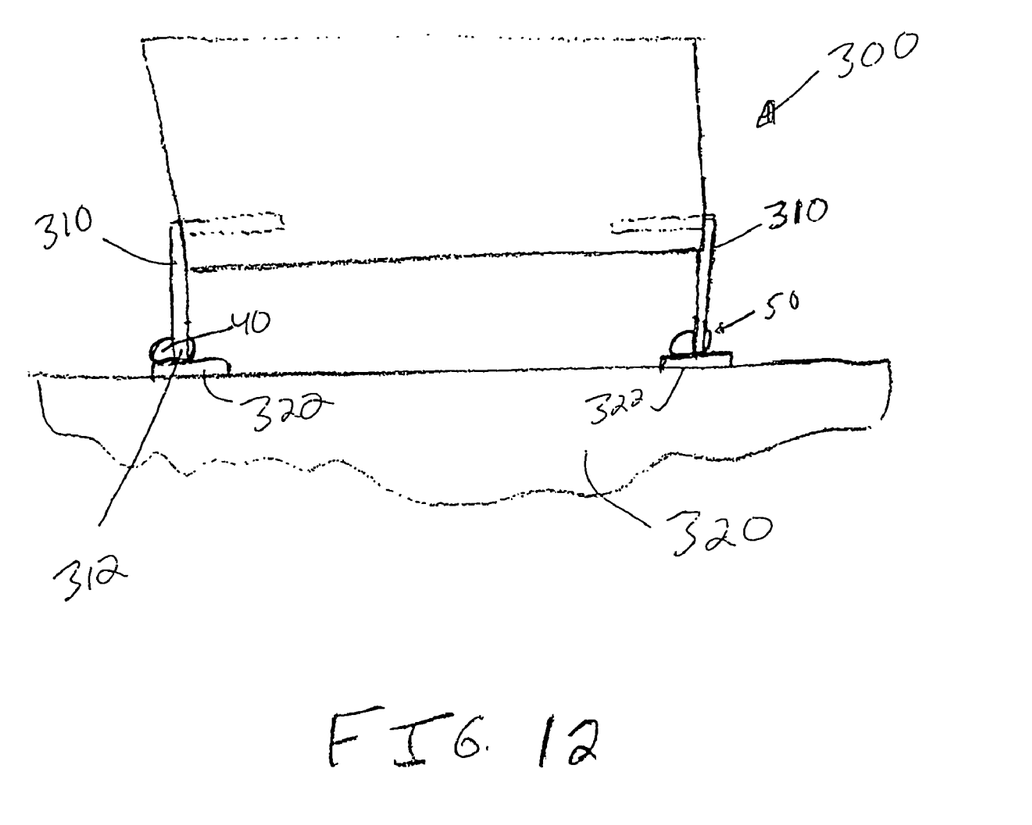
FIG. 12 is a side elevational view of one exemplary circuit component having solder-bearing terminals and adapted for surface mounting on a substrate.

In yet another embodiment illustrated in FIG. 12, a circuit component or device 300 is provided. The circuit component has one or more terminals 310 that are each connected to circuit elements within the device 300 in any suitable manner. The terminals 310 have terminal ends 312 that each carry at least one solder mass 40. The terminal end 312 is formed to include a plurality of slots (similar to the lead 10 of FIG. 1) that receive and hold the solder mass 40 by forming solder rivets 50 within the slots.

The device 300 with its terminals 310 can then be placed upon a substrate 320 having electrical conducting areas or pads 322 upon each of which a terminal 310 is placed with the solder mass 40 in contact with the conducting area 322. It will be understood that thereafter, by appropriately applying heat, the solder mass 40 is melted, and upon solidification forms a reliable electrical and mechanical joint between the terminal 310 and the conductive area 322.

It will be understood that the exemplary solder-retaining arrangement and method of holding a solder mass in a solder-bearing component of the present application can be used in any number of applications, including being used as a terminal portion of other forms of leads, terminals, contacts, and connectors. The present embodiments are merely exemplary and the method of retaining a solder mass by forming a series of solder rivets can be used in most applications where solder is held.

In yet another application, the solder-bearing article can be in the form of an article which is to be securely connected to another article. In this embodiment, the solder mass 40 does not necessarily have to provide an electrical bridge from one component to another component but rather can simply act to provide a structural connection between the two components. In other words, this application encompasses the traditional applications where a solder mass was used as vehicle to provide a strong structural connection between two articles.

FIGS. 13 through 16 illustrate one exemplary application where the solder mass is used to provide a structural connection between two articles. In FIGS. 13 through 16, an electromagnetic shield according to a first exemplary embodiment is generally indicated at 400. The electromagnetic shield 400 has an upper wall 420 that defines an upper surface 422 and includes opposing side walls 430 and opposing end walls 440. When the electromagnetic shield 400 is mounted to a component side of an electronic component, such as a printed circuit board (PCB)(not shown), the upper surface 422 of the upper wall 420 faces away from the electronic component. Preferably, the electromagnetic shield 400 is preferably formed as a unitary member and therefore, the opposing side walls 430 and opposing end walls 440 are preferably integrally formed with the upper wall 420.

Figure 14:
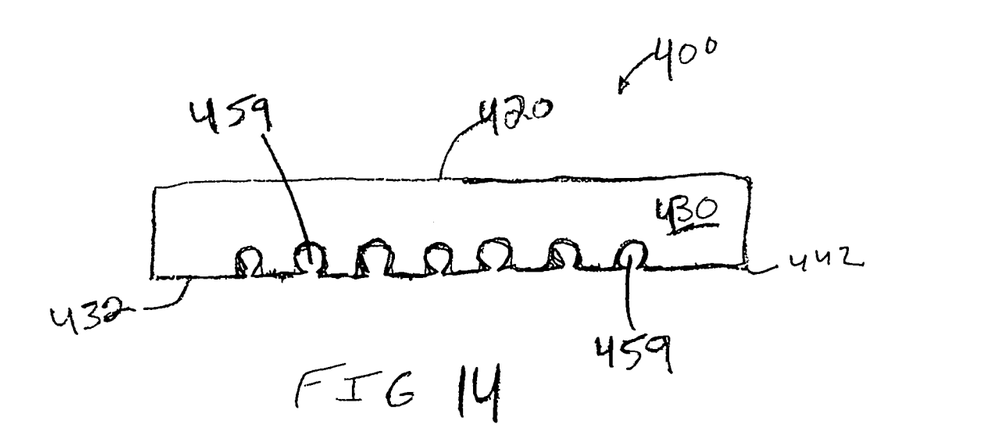
FIG. 14 is a side elevational view of the electromagnetic shield of FIG. 13.

As illustrated in the embodiment of FIG. 14, the electromagnetic shield has a plurality of slots 459 that are formed along a respective side wall 430. According to one exemplary embodiment, the slots 459 are provided on each of the opposing side walls 430. The slots 459 are formed along a length of the side wall 430, preferably at a lower edge 432 thereof and are defined by an open first end at the lower edge 432 and a closed second end. In the illustrated embodiment, the closed second end of the slot 459 is rounded; however, it will be understood that the slot 459 can be formed to have any number of shapes, i.e., a rectangular shape by having a planar second slot end.

Figure 13:
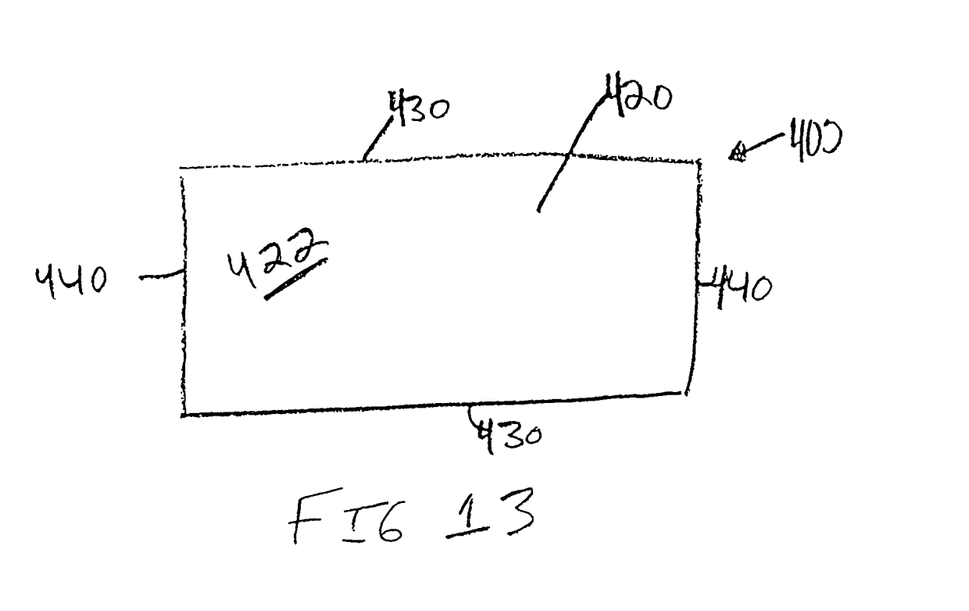
FIG. 13 is a top plan view of an electromagnetic shield according to a first exemplary embodiment.

As shown in FIGS. 13 and 14, each side wall 430 connects at an upper end thereof to the upper wall 420 with the side wall 430 preferably being substantially perpendicular to the upper wall 420. The lower edge 432 of the side wall 430 is preferably contained within the same plane as a lower edge 442 of each of the end walls 440. The lower edges 432, 442 are ground contacting surfaces as these edges 432, 442 contact and seat against the electronic component (not shown) when the electromagnetic shield 400 is mounted to the electronic component.

The electromagnetic shield 400 is formed of a suitable material that has properties that permit the electromagnetic shield 400 to function as an electromagnetic shield that prevents electromagnetic energy, e.g., radiated RF signals, from entering the shielded volume or area that is defined underneath the electromagnetic shield 400 and between the electromagnetic shield 400 and the component side of the electronic component.

The number of slots 459 formed on each side wall 430 varies according to a number of factors, including the dimensions of the electromagnetic shield 400 and the desired number of solder retention points. The end walls 440 can also have a plurality of slots 459 formed therein for retaining one or more solder masses 40.

Figure 15:
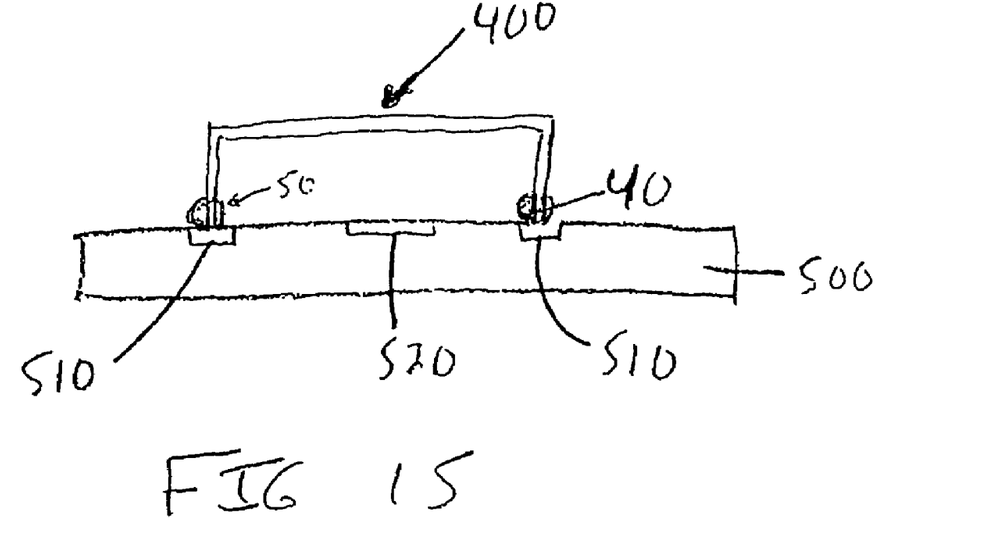
FIG. 15 is a cross-sectional view of the electromagnetic shield of FIG. 13 being positioned relative to an electronic component, such as a printed circuit board.

After the solder mass 40 is securely retained within the slots 30 by forming the solder rivets 50, the electromagnetic shield 400 is placed on an electronic component, such as the printed circuit board (PCB) 500, shown in FIG. 15. FIG. 15 shows a cross-sectional view of the electromagnetic shield 400 placed on top of the printed circuit board 500. The printed circuit board 500 contains a number of pads 510 that are formed of a solderable material. The printed circuit board 500 also contains certain sensitive elements 520, i.e., circuitry components, which are to be shielded from undesirable emissions. The electromagnetic shield 400 is therefore arranged on the printed circuit board 500 such that the solder mass 40 is generally disposed over the pads 510, as shown in FIG. 15. The solder mass 40 is then reflowed using conventional techniques, such as applying heat to the solder mass. The heat can be delivered in any number of forms, including hot air that is directed onto the solder mass 40 or the entire assembly can be subjected to an elevated temperature, causing the solder reflow, so long as the printed circuit board 500 is not damaged.

Figure 16:
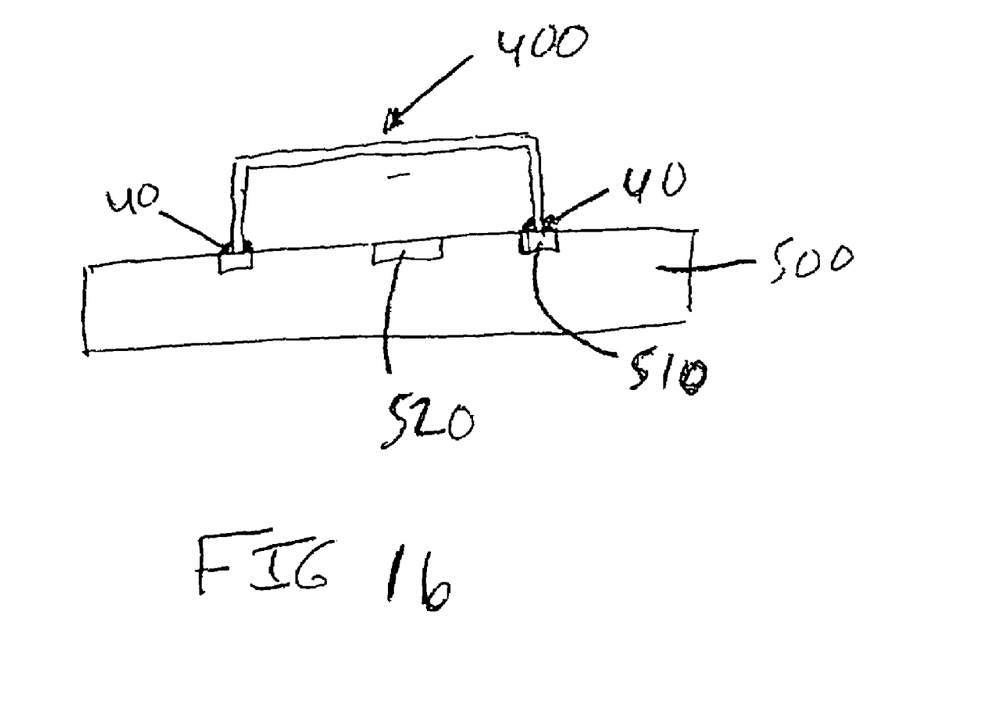
FIG. 16 is a cross-sectional view of the electromagnetic shield of FIG. 15 being securely mounted to the electronic component after a solder reflow operation has been performed.

FIG. 16 shows the solder mass 40 after it has been reflowed, thereby producing a secure solder connection between the electromagnetic shield 400 and the printed circuit board 500. With the electromagnetic shield 400 secured in place, the shield 400 covers the sensitive elements 510 formed on the printed circuit board from any neighboring emitting components.

If removal of the electromagnetic shield 400 is necessary, the solder connection between the electromagnetic shield 400 and the printed circuit board 500 can be broken by heating the solder mass 40 to cause the solder mass 40 to reflow. The electromagnetic shield 400 is then removed and access is provided to the sensitive elements 510. If the electromagnetic shield 400 is to be reapplied, a new solder mass 40 (i.e., solder wire) is simply interleaved between the fingers 450 using the technique disclosed hereinbefore. After closing the fingers 450 so that the solder mass 40 is securely retained, the electromagnetic shield 400 is properly positioned relative to the printed circuit board 500 and the solder mass 40 is reflowed to provide the solder connection between the electromagnetic shield 400 and the printed circuit board 500.

It will be understood that for each of the application disclosed herein, the solder mass 40 does not have to be in the form of a continuous length of solder wire; but rather, can be in the form of two or more separate smaller solder wire segments.

Thus, the present method of retaining a solder mass within a solder-bearing component offers several advantages over conventional methods. For example, conventional solder retaining techniques included using a number of solder slugs having certain dimensions, while the present method utilizes solder wire and thus less solder members are used and partitioning of the solder wire into solder slugs is eliminated. This reduces time and cost.

Moreover, it will be understood that the solder mass 40 does not have to extend across the entire lower edge of the lead or the like but rather a smaller length of solder mass 40 can be retained within some but not all of the slots 30 formed within the lead or the like.

While the invention has been particularly shown and described with reference to preferred embodiments thereof, it will be understood by those skilled in the art that various changes in form and details may be made therein without departing from the spirit and scope of the invention.

What is claimed is:

1. A solder-bearing article comprising:
   a body having a first face, a second face, and a plurality of openings formed therein; and
   a solder mass securely held by the body, the solder mass having a first section disposed along the first face such that the solder mass is disposed over at least some of the plurality of openings, the solder mass having a second section disposed along the second face and in the form of at least one rivet head that forms a part of a solder rivet that extends through one opening from the first face and serves to securely hold the solder mass on the body.

2. The solder-bearing article of claim 1, wherein the solder mass is a solder wire that extends along one edge of the body.

3. The solder-bearing article of claim 1, wherein the solder-bearing component is selected from the group consisting of: a lead, a terminal, an electrical connector, and an electromagnetic shield.

4. The solder-bearing article of claim 1, wherein the solder mass disposed along the second face has a series of recessed portions that are axially aligned with the plurality of openings.

5. The solder-bearing article of claim 1, wherein the head has a hemispherical shape.

6. The solder-bearing article of claim 1, wherein the plurality of openings is formed at a lower edge of the body.

7. The solder-bearing article of claim 1, wherein the plurality of openings is formed in an medial section of the body.

8. The solder-bearing article of claim 1, wherein the solder mass has a plurality of rivet heads that are associated with a plurality of solder rivets that extends through a plurality of the openings and serve to securely hold the solder mass on the body.

9. A solder-bearing article comprising:
a body having a first face, a second face, and a plurality of slots formed therein; and
a solder mass securely held by the body, the solder mass having a first section disposed along the first face such that the solder mass is disposed over at least some of the plurality of slots, the solder mass being deformed so that a plurality of rivet heads are formed along the second face, the rivet heads being part of a plurality of solder rivets that extend through preselected slots from the first face and serve to securely hold the solder mass on the body.

10. The solder-bearing article of claim 9, wherein the plurality of lots are formed along one edge of the body and are open along the one edge.

* * * * *